United States Patent [19]
Takaishi

[11] Patent Number: 6,063,669
[45] Date of Patent: May 16, 2000

[54] MANUFACTURING METHOD OF SEMICONDUCTOR MEMORY DEVICE HAVING A TRENCH GATE ELECTRODE

[75] Inventor: Yoshihiro Takaishi, Tokyo, Japan

[73] Assignee: NEC Corporation, Tokyo, Japan

[21] Appl. No.: 08/805,273

[22] Filed: Feb. 25, 1997

[30] Foreign Application Priority Data

Feb. 26, 1996 [JP] Japan .................................... 8-037950

[51] Int. Cl.[7] ..................... H01L 21/336; H01L 21/8242
[52] U.S. Cl. .......................... 438/270; 438/243; 438/253
[58] Field of Search ................... 438/242–256, 438/386–399, 268–272; 257/301–302, 60, 135–136, 328–334, 263–267

[56] References Cited

U.S. PATENT DOCUMENTS 5,283,201    2/1994    Tsang et al. .

*Primary Examiner*—Jey Tsai
*Attorney, Agent, or Firm*—Hutchins, Wheeler & Dittmar

[57] ABSTRACT

A manufacturing method provides a semiconductor device having a trench gate type transistor and a planer type transistor gate electrodes are formed certainly and without increasing the number of photolithography steps. After formation of a gate insulating film, a polysilicon film, and a WSi film for a transistor in a peripheral circuit section, an oxide film is formed on the entire surface of the resultant structure. Subsequently, the oxide film in a trench formation region is selectively removed in a memory cell array section and the oxide film other than a gate electrode formation region is selectively removed in the peripheral circuit section. A silicon substrate is etched using the remaining oxide film as a mask to form a trench in the memory cell array section, and the polysilicon film and the WSi film are etched to form the gate electrode in the peripheral circuit section. Thereafter, a gate insulating film and a gate electrode for a cell transistor are formed in the trench of the memory cell array section.

13 Claims, 11 Drawing Sheets

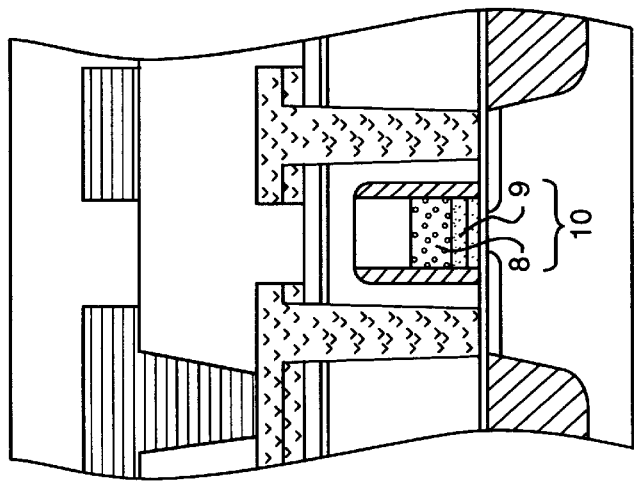
FIG. 1C
(PRIOR ART)
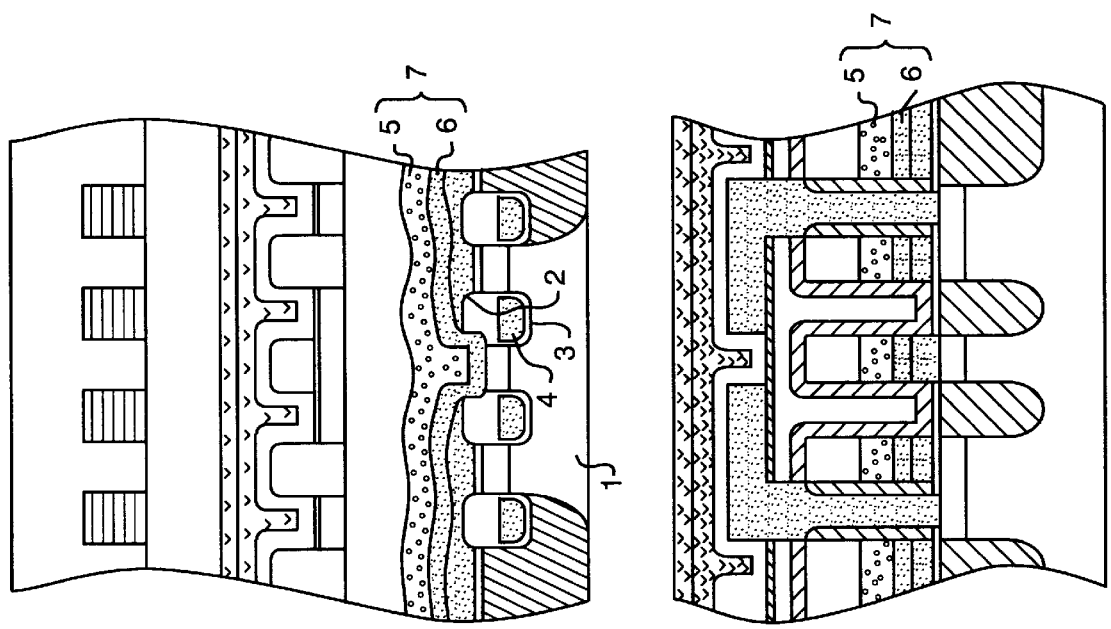
FIG. 1A
(PRIOR ART)
FIG. 1B
(PRIOR ART)

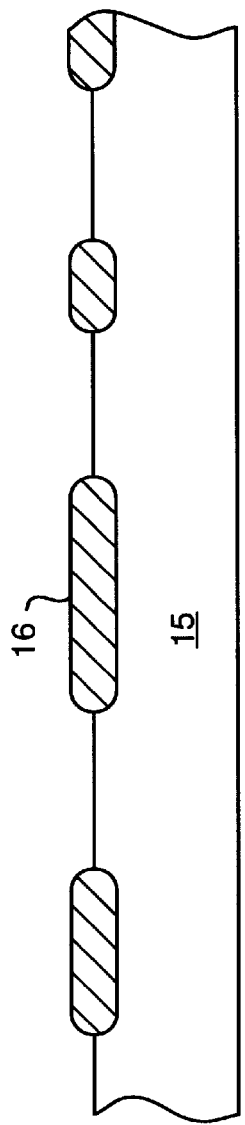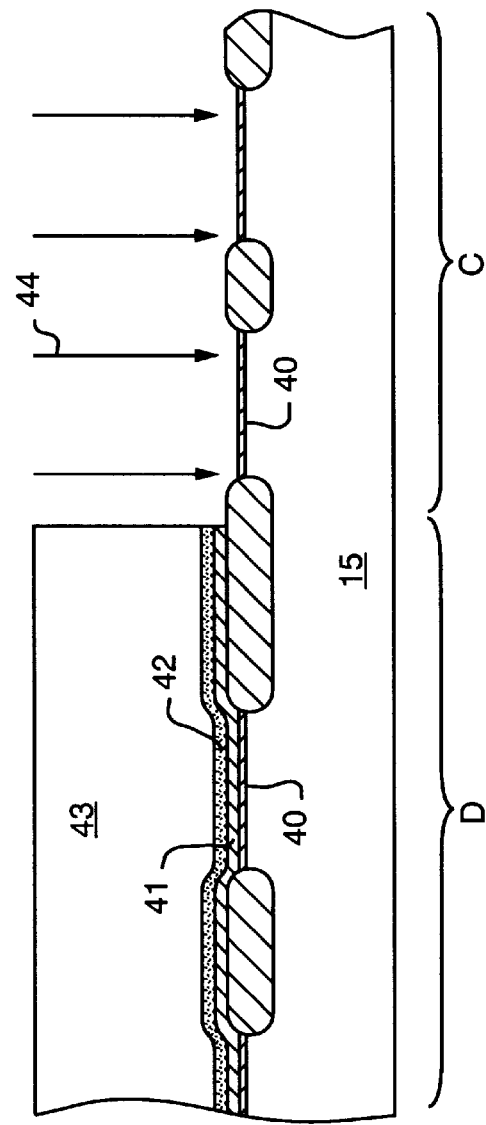

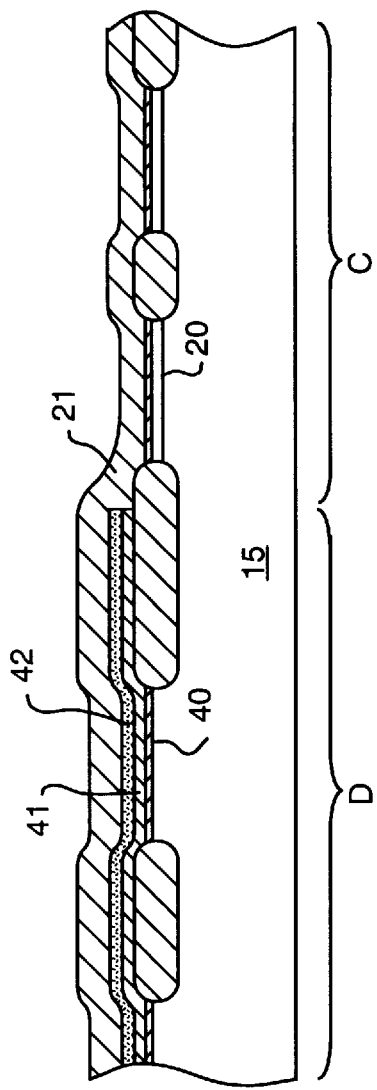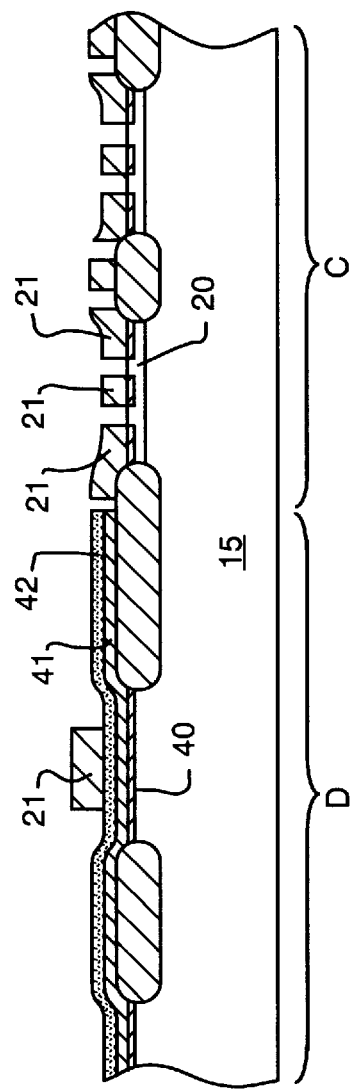

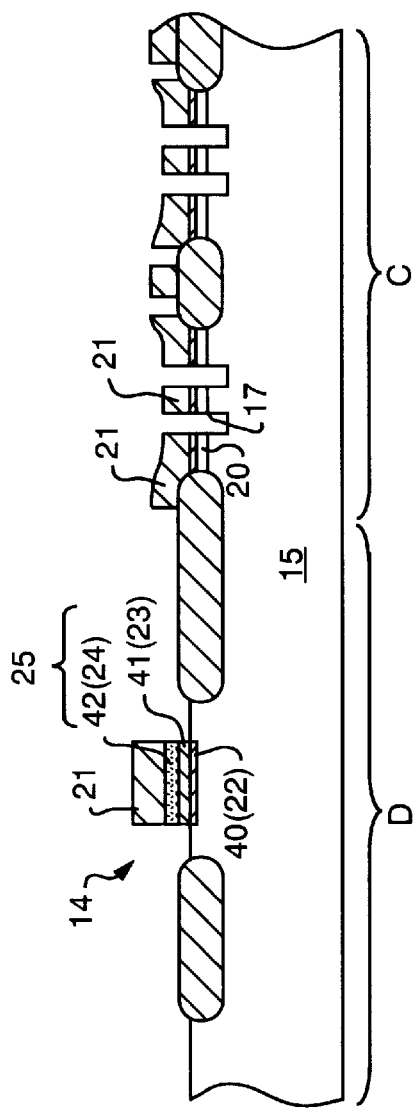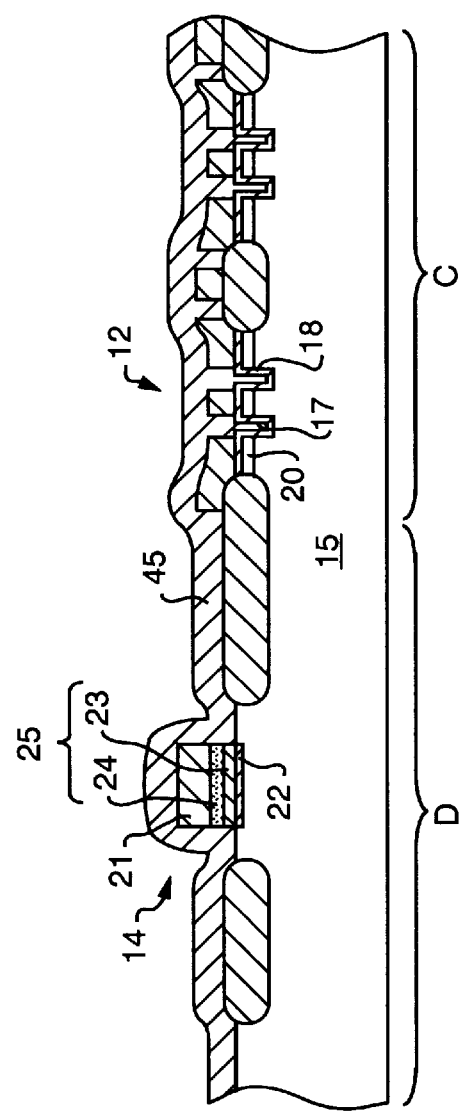

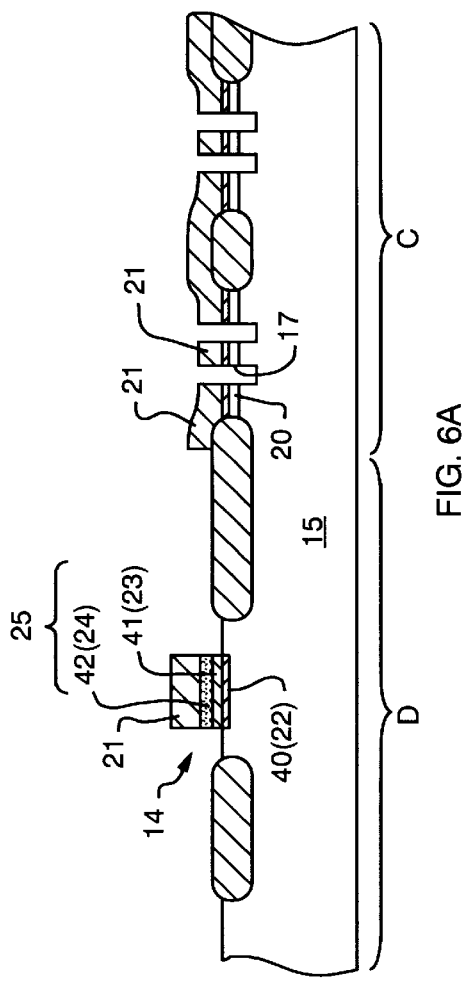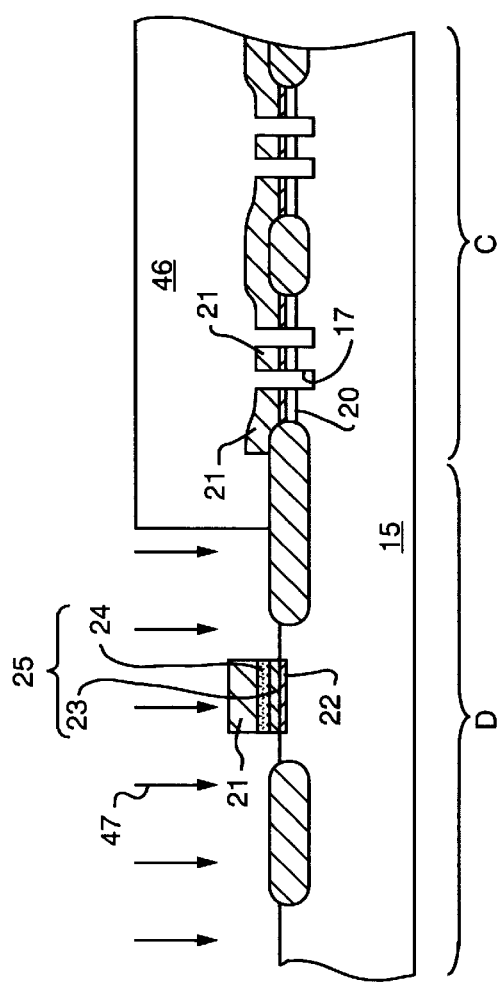

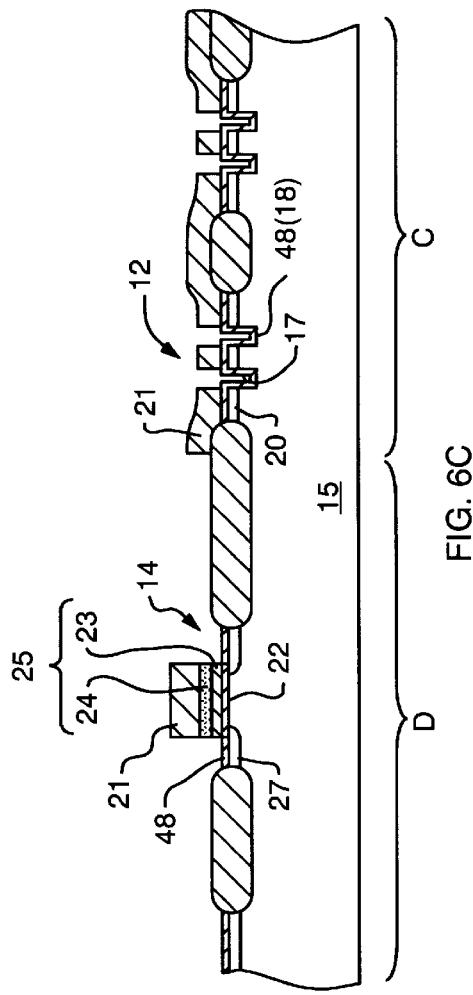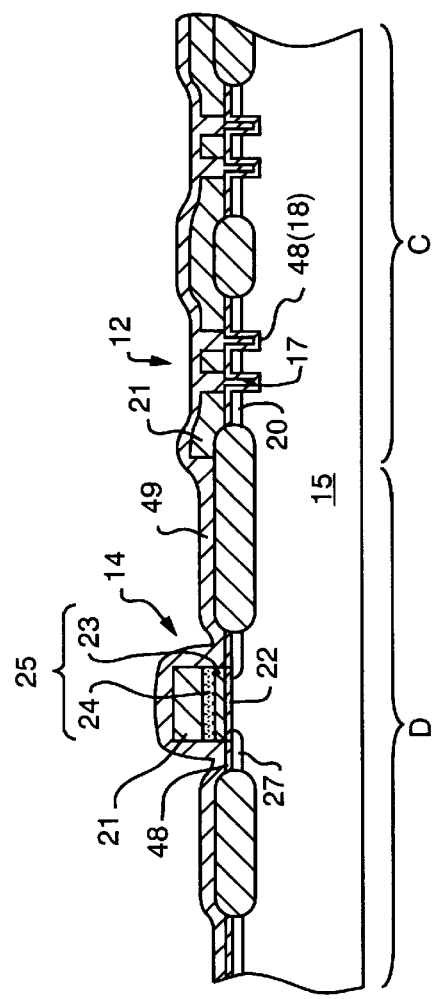

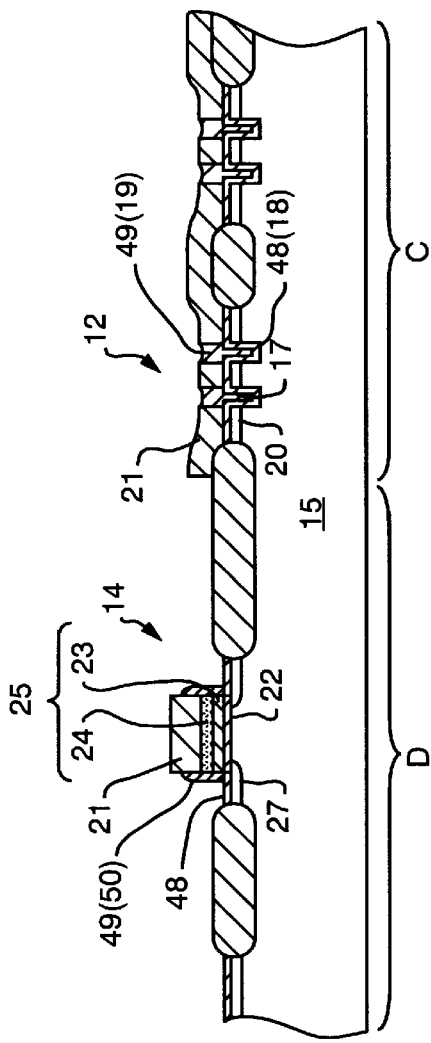
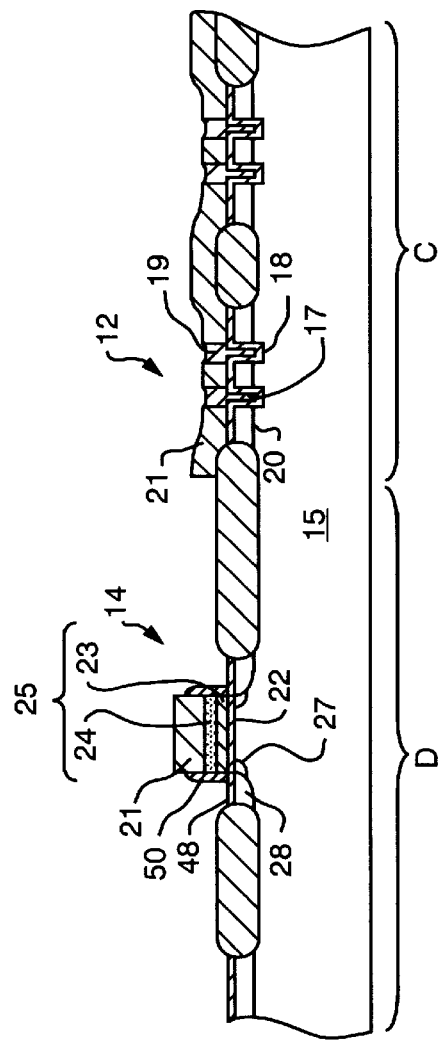

MANUFACTURING METHOD OF SEMICONDUCTOR MEMORY DEVICE HAVING A TRENCH GATE ELECTRODE

BACKGROUND OF THE INVENTION

1. Field of the Invention

The present invention relates to a manufacturing method of a semiconductor memory device and more particularly to a manufacturing method of a semiconductor memory device such as a dynamic random access memory (hereinafter referred to as a DRAM).

2. Description of the Related Art

Advancement of high integration of DRAM has facilitated micronization of memory cells using DRAM. Difficulties with micronizing the memory cells include providing sufficient memory capacitance in spite of the fact that the memory cells are micronized while forming cell transistors having desirable characteristics. Stacked type capacitors having a charge storage portion stacked on the cell transistor have been adopted as a means for providing sufficient cell capacitance. On the other hand, as for the characteristics of the cell transistors, controlling diffusion layer concentration is a factor to be considered in connection with the micronization of the memory cells. When considering shortening a channel length, the presence of thermal treatment processes such as flattening of an interlayer insulating film and formation of a capacitance portion makes it so that the expansion of a diffusion layer depth cannot be controlled so that a short channel effect of transistors is made more noticeable. Thus, such transistors may be difficult or impossible to use as cell transistors.

A proposed solution to such problems is the use of so called trench gate type transistors, which have a gate electrode buried in a trench (groove) previously formed in a semiconductor substrate. This trench gate type transistor reduces the short channel effect by lengthening the effective channel length by means of the formation of the gate electrode in the trench. However, the long channel length generally increases channel resistance and thus decreases drivability of the transistor. As the drivability of the transistor decreases, the transistor becomes less suitable for performing high speed operation as a semiconductor device. However, it is not as critical to micronize driving circuits and signal processing circuits arranged around the memory cells in which it is desirable to perform a high speed operation as it is to micronize the cell transistors themselves. For this reason, it is preferable to use conventional planer type transistors in the interest of high speed operation over micronization. However, combining the planer type transistors for the drive and signal processing circuits with trench type transistors for the memory cells creates a problem in that individual formations of the two type transistors, each having different structures, in the single semiconductor device results in an increase in manufacturing steps.

A method of forming the two type transistors in a single semiconductor device without too much of an increase in the manufacturing steps is disclosed in Laid Open Japanese Patent Application No. Heisei 7-66297. FIGS. 1A, 1B, and 1C shows a structure of a DRAM like that disclosed in this patent application. FIGS. 1A and 1B show a memory cell section, and FIG. 1C shows a sectional view of the structure of a periphery circuit section. The DRAM has a gate electrode which is formed using an electrode layer serving as a bit line in the memory cell array. The formation method of the DRAM will be described briefly. As shown in FIG. 1A, a trench 2 is formed in a silicon substrate 1 and a gate electrode 4 is buried in the trench 2 interposed by a gate insulating film 3, whereby a transistor in a memory cell is formed. Thereafter, as shown in FIGS. 1B and 1C, a bit line 7 in the memory cell with a polycide structure is formed, which is formed of a polycrystalline silicon film 6 and a tungsten silicide film 5. On the other hand, as shown in FIG. 1B, in the periphery circuit section, a gate electrode 10 of the transistor is formed using the same layers 8 and 9 as the polycrystalline silicon film 6 and the tungsten silicide film 5 constituting the bit line 7 in the memory cell.

In the foregoing conventional semiconductor memory device, the gate electrode of a transistor of the periphery circuit section is formed of the same film constituting the polycide layer, which is formed after the formation of the cell transistor and constitutes the bit line. The transistor of the periphery circuit section will be necessarily formed after the formation of the cell transistor. Therefore, when the gate insulating film (oxide film) of the transistor constituting the periphery circuit section is formed, an interlayer insulating film between the gate electrode and the word/bit line are also formed in the cell transistor side. In such situation, when the gate oxidation is performed for the periphery circuit section, reliability of the gate insulating film of the transistor constituting the periphery circuit section is deteriorated due to influences of impurities and the like, contained in the gate electrode or the interlayer insulating film formed in the memory cell array section.

Furthermore, the bit line located above the cell transistor is used as the gate electrode of the transistor of the periphery circuit section. Specifically, on the formation of the gate electrode of the transistor constituting the periphery circuit section, a high step difference is created by the interlayer insulating film between the gate electrode of the cell transistor and the word/bit line. If this high step difference is present locally, the unetched portion is left in the step difference after etching of the gate electrode of the transistor of the periphery circuit section. As a result, the formation of the gate electrode becomes difficult.

To solve this problem, it is possible to make the inclination of the step difference gentle. For this purpose, the distance between the cell array section and the periphery circuit must be large. This is contrary to the recent trend to reduce the device area. Furthermore, when the bit line is micronized, a focus margin is reduced in photolithography processes, so that flattening of the underground layer is needed. However, in the foregoing semiconductor memory device, the step difference between the bit line of the transistor of the memory cell array section, and the gate electrode of the transistor of the peripheral circuit section is too large, so that patterning for the bit line becomes difficult or impossible.

SUMMARY OF THE INVENTION

The present invention addresses the above-described problems, in a semiconductor device which comprises both of a trench gate type transistor and a planer type transistor. An object of the invention is to provide a manufacturing method of the semiconductor device which is capable of reliably forming gate electrodes of these transistors without increasing manufacturing steps, especially lithography steps, even in the event that additional micronization of the device is imposed.

To achieve the foregoing object, in a manufacturing method of a semiconductor device of the present invention, which comprises two types of transistors such as a trench gate type transistor and a planer type transistor, the trench gate type transistor having a gate electrode buried in a trench formed in a semiconductor substrate and the planer type transistor having a gate electrode on the semiconductor substrate, and a photolithography step for forming a trench of the trench gate type transistor, and a photolithography step for forming the gate electrode of the planer type transistor, are the same step.

In more detail, in a manufacturing method of a semiconductor device which comprises a memory cell array section using as a cell transistor a trench gate type transistor, and a peripheral circuit section composed of a planer type transistor, the trench gate type transistor having a gate electrode buried in a trench formed in the semiconductor substrate and the planer type transistor having a gate electrode formed on the semiconductor substrate, the manufacturing method includes forming sequentially basic materials on the semiconductor substrate located at the peripheral circuit section, the basic materials being for a gate insulating film of a transistor in the peripheral circuit section and for the gate electrode thereof, depositing a mask film on the entire surface of the resultant structure, selectively removing, in the memory cell array section, the mask film corresponding to a region where the trench is to be formed using a photolithography technique, and selectively removing, in the peripheral circuit section, the mask other than the a region where the gate electrode of the transistor of the transistor using the lithography technique, etching the semiconductor substrate in the memory cell array section using the mask film patterned in the prior step as a mask to form the trench, and etching the basic material for the gate electrode of the transistor in the peripheral circuit section to form the gate electrode thereof, and sequentially, in the trench, forming a gate insulating film of the cell transistor and a gate electrode thereof.

In the foregoing manufacturing method of the semiconductor device, the gate insulating film of the cell transistor is formed thicker than the gate insulating film of the transistor in the peripheral circuit section. When the gate insulating film for the cell transistor is formed in the trench, the thick gate insulating film is simultaneously formed also on the semiconductor substrate located at the side of the gate electrode of the transistor in the peripheral circuit section. Thereafter, a side wall gate is formed on a side wall of the gate electrode of the transistor in the peripheral circuit section, as well as the formation of the thick gate insulating film at the bottom of the side wall gate.

Furthermore, in this case, after the gate insulating films are simultaneously formed in the trench and on the semiconductor substrate located around the gate electrode of the transistor in the peripheral circuit section,, the basic material for the gate electrode of the cell transistor is formed on the entire surface of the resultant structure. Subsequently, the entire surface of the resultant structure is subjected to an anisotropic etching to be etched-back, whereby the gate electrode of the cell transistor is formed in the trench and, at the same time, the side wall gate is formed on the side wall of the gate electrode of the transistor in the peripheral circuit section.

In the manufacturing method of the present invention, the trench for the trench gate type transistor and the gate electrode of the planer type transistor are formed by the same photolithography step, so that the number of the photolithography steps may be less than that of the conventional manufacturing method and the gate electrodes of each of the transistors formed of the layers located at approximately the same level. Accordingly, a high step difference between the memory cell array section and the peripheral circuit section is never produced, whereby the gate electrodes of each of the transistors can be formed without hindrance.

BRIEF DESCRIPTION OF THE DRAWINGS

The present invention will be better understood from the following more detailed description taken in conjunction with the accompanying drawings and appended claims, in which:

FIG. 1A to 1C are sectional views showing a conventional semiconductor device;

FIGS. 5A to 5H are sectional views showing manufacturing steps of the semiconductor device of the first embodiment of the present invention; and FIGS. 6A to 6F are sectional views showing manufacturing steps of a semiconductor device of a second embodiment of the present invention.

DETAILED DESCRIPTION OF THE PREFERRED EMBODIMENTS

A manufacturing method of a semiconductor device of a first embodiment of the present invention will be described with reference to FIGS. 2 to 5H.

Figure 2:
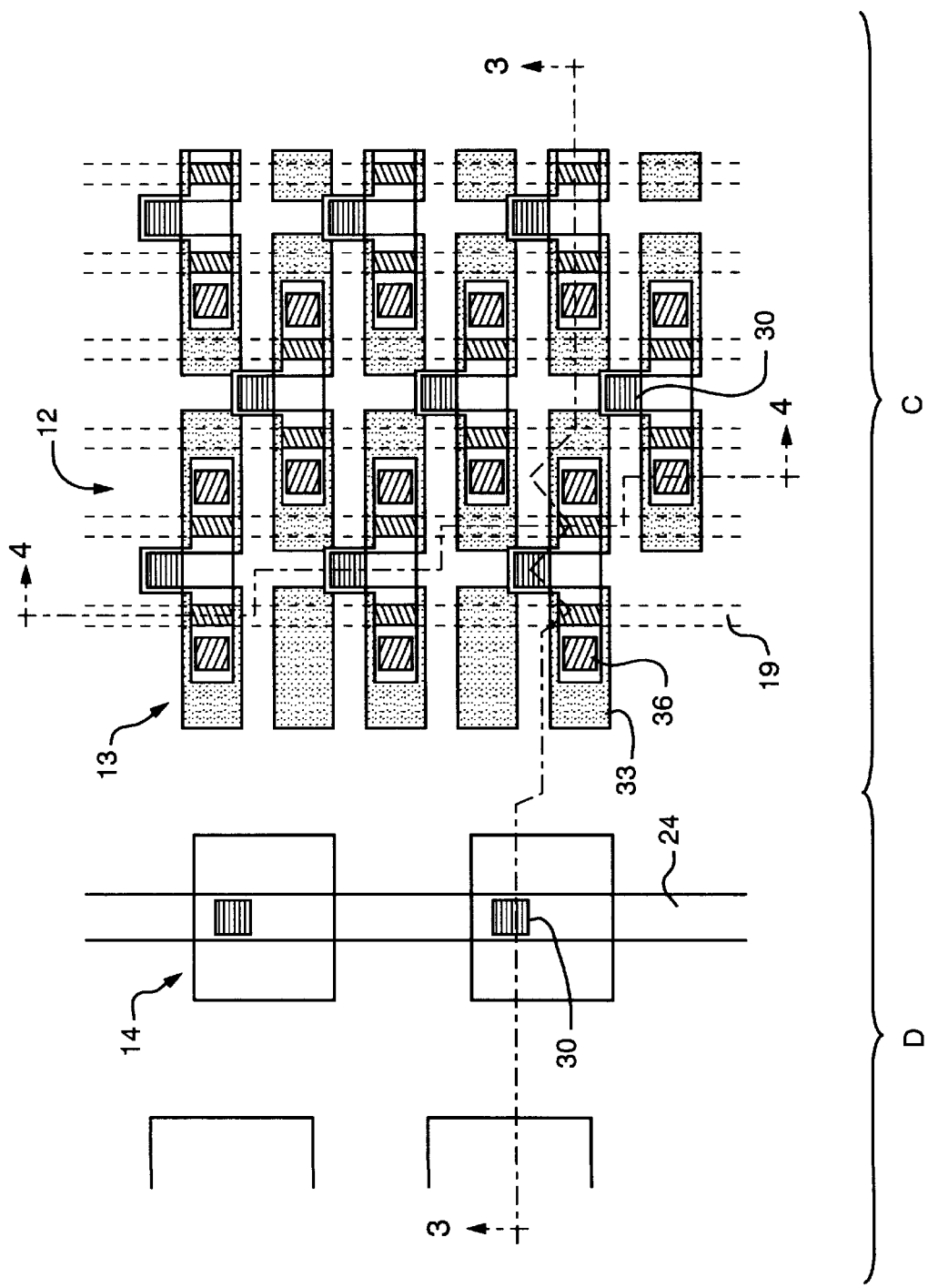
FIG. 2 is a plan view showing a semiconductor device of a first embodiment of the present invention.
Figure 3:
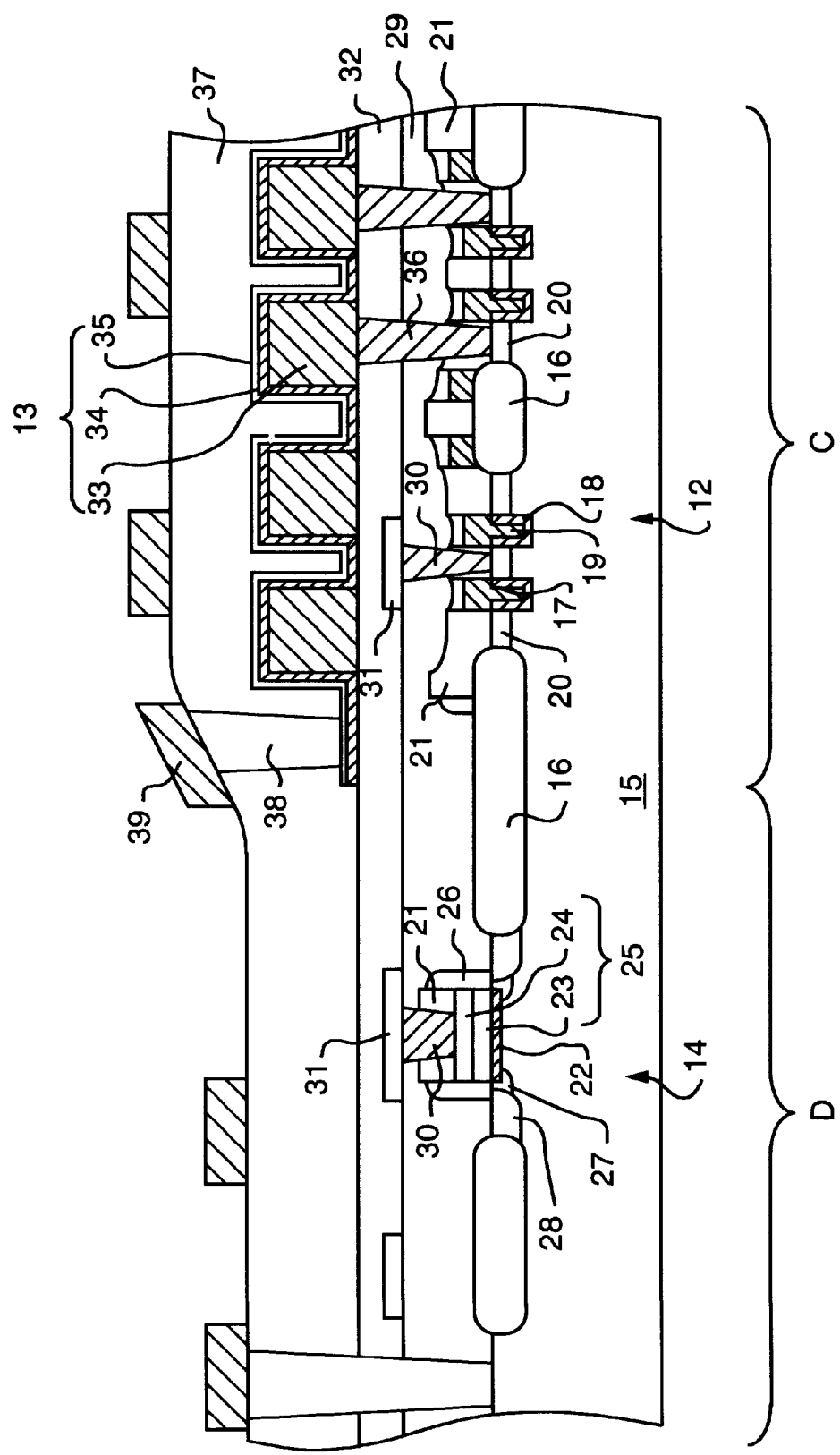
FIG. 3 is a sectional view of the semiconductor device of the first embodiment of the present invention, taken along the line A—A of FIG. 2.
Figure 4:
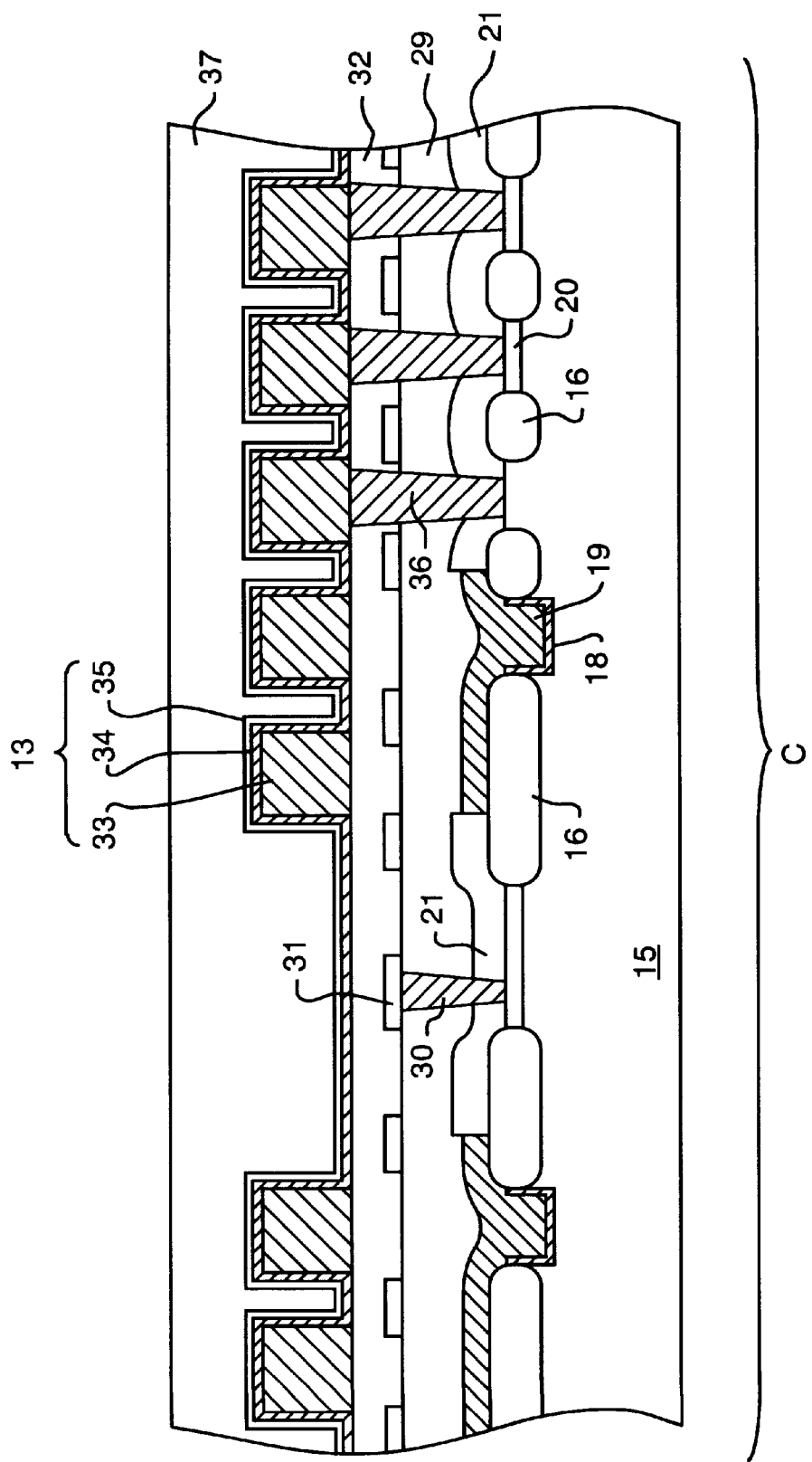
FIG. 4 is a sectional view of the semiconductor device of the first embodiment of the present invention, taken along the line B—B of FIG. 2.

FIG. 2 is a plan view showing a memory cell end portion of a semiconductor device of a first embodiment of the present invention. FIG. 3 is a sectional view taken along the line A—A of FIG. 2. FIG. 4 is a sectional view taken along the line B—B of FIG. 2.

As shown in FIG. 2, the semiconductor device of the first embodiment of the present invention comprises a memory cell array section C and a peripheral circuit section D. In the memory cell array section C, a plurality of cell transistors 12 and a plurality of cell capacitors 13 are arranged in a somewhat repeating pattern. In the peripheral circuit section D, transistors 14 are arranged.

As shown in FIGS. 3 and 4, an Element isolation region 16 is formed on a p-type silicon substrate 15, and a trench 17 is formed in a portion of the silicon substrate 15 corresponding to the memory cell array section C. A gate insulating film 18 is formed on the side wall and bottom of the trench 17. Thereafter, a gate electrode 19 is buried in the trench 17. Moreover, an $N^-$-type diffusion layer 20, serving as source/drain regions, is formed on both sides of the gate electrode 19, and an oxide film 21, used as a mask at the time of the formation of the trench 17, is deposited on the diffusion layer 20.

On the other hand, as shown in FIG. 3, a gate insulating film 22 is formed on the silicon substrate 15 corresponding to the peripheral circuit section D, and a gate electrode 25 having a two layer structure formed of a lower gate electrode 23 and an upper gate electrode 24 is formed on the gate insulating film 22. Then, a side wall oxide film 26 is formed on a side wall of the gate electrode 25. Source and drain regions of the transistor 14 in the peripheral circuit section are diffusion layers of an LDD (an Lightly Doped Drain) structure, which are composed of an $N^-$-type diffusion layer 27 and an $N^+$-type diffusion layer 28.

As shown in FIGS. 3 and 4, the cell transistor 12 and the transistor 14 in the peripheral circuit section are covered with a first interlayer insulating film 29. A bit contact 30 is formed in the first interlayer insulating film 29, and, moreover, a bit line 31 is formed on the bit contact 30. Then, a second interlayer insulating film 32 is deposited on the bit line 31, and the cell capacitor 13, composed of a lower capacitance electrode 33, a capacitance dielectric film 34, and an upper capacitance electrode 35, is formed on the second interlayer insulating film 32. A capacitance contact 36 is formed so as to penetrate through the first and second interlayer insulating films 29 and 32, whereby the lower capacitance electrode 33 and the N⁻-type diffusion layer 20 are electrically connected. Furthermore, the cell capacitor 13 is covered with a third interlayer insulating film 37, and a second contact 38 is formed. An aluminum wiring 39 is formed on the second contact 38.

Subsequently, a manufacturing method of the above described semiconductor device will be described with reference to the drawings.

FIGS. 5A to 5H illustrate manufacturing steps of the above-described semiconductor device of the present invention. In the following description, the manufacturing steps from the formation of an element isolation region to the formation of the cell transistor and the transistor in the peripheral circuit section will be described. These steps are features of the present invention.

First, as shown in FIG. 5A, the element isolation region 16 of a LOCOS (a Local Oxidation of Silicon) type is formed on the p-type silicon substrate 15. Subsequently, as shown in FIG. 5B, a silicon oxide film 40 of about 8 nm thick is formed on the surface of the silicon substrate 15 by an oxidation treatment, which serves as a gate insulating film of the transistor in the peripheral circuit section. A polysilicon film 41 (a gate electrode basic material) of 100 nm thick and a tungsten silicide (hereinafter referred to as a WSi) film 42 (a gate electrode basic material) of 100 nm thick are sequentially formed on the oxide film 40. The polysilicon film 41 is to serve as the lower gate electrode of the transistor in the peripheral circuit section, and the WSi film 42 is to serve as the upper gate electrode of the transistor in the peripheral circuit section. Subsequently, in connection with using photolithography, a resist pattern 43 covering the peripheral circuit section D is formed. The WSi film 42 and polysilicon film 41 of the memory cell array section C are removed using the resist pattern 43 as a mask. Thereafter, while the foregoing resist pattern 43 is left on the peripheral circuit section D, injection of impurity ions 44 is performed for the memory cell array section C to form an N⁻-type diffusion layer 20 in the memory cell array section C (see FIGS. 5B and 5C). This photolithography step that is performed is similar to steps performed in ordinary processes to form the N⁻-type diffusion layer 20 of the memory cell array section C. Therefore, the manufacturing method of this embodiment does not add new photolithography steps.

Next, after removing the resist pattern 43, as shown in FIG. 5C, an oxide film 21 (a masking film) of about 200 nm thick is formed on the entire surface of the resultant structure, which is to serve as a mask in following processes. As shown in FIG. 5D, in the memory cell array section C, the oxide film 21 is selectively removed, using photolithography, in a region where a trench is to be formed, and, at the same time, in the peripheral circuit section D, the oxide film 21 is also selectively removed in a region other than where the gate electrode of the transistor of the peripheral circuit section is to be formed. Thereafter, as shown in FIG. 5E, using the oxide film 21 patterned in the preceding step as a mask, the silicon substrate 15 in the memory cell array section C is etched to form the trench 17, and, at the same time, the WSi film 42 and polysilicon film 41 in the peripheral circuit section D are etched to form the gate electrode 25 of the transistor 14 of the peripheral circuit section. This etching treatment is performed by mixing gas of SF₆ and HBr to be used as etching gas, whereby the simultaneous etching of the WSi film 42 and the silicon substrate 15 is possible. In addition, it suffices that the trench 17 may have a width less than 0.2 μm and a depth deeper than that of the N⁻-type diffusion layer 20.

Thereafter, as shown in FIG. 5F, an oxide film is formed on the surface of the silicon substrate 15 in the trench 17 by an oxidation treatment. This oxide film is used as the gate insulating film 18 of the cell transistor 12. Subsequently, a polysilicon film 45 (a gate electrode basic material) of about 300 nm thick is deposited on the entire surface of the resultant structure, so that the trench 17 is buried with this polysilicon film 45. At this time, since the width of the trench is set to be less than 0.2 μm, the polysilicon film 45 of about 300 nm can fill the trench 17 sufficiently.

Figure 5G:
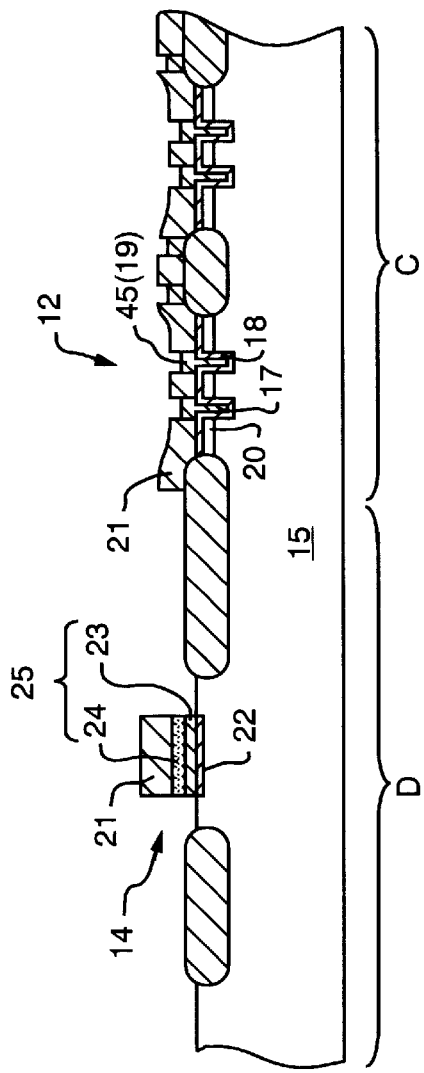
Figure 5H:
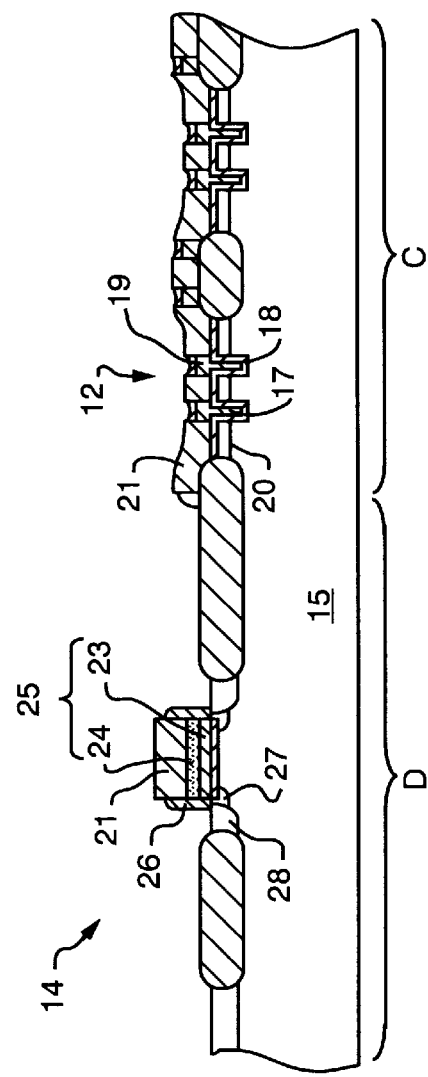

Next, as shown in FIG. 5G, the polysilicon film 45 deposited on the entire surface of the resultant structure is etched-back so that the polysilicon film 45 is left only in the trench 17. When this etching-back treatment is performed, with the use of the etching gas containing SF₆ as a main component, an isotropic etching can be performed so that it is possible to leave the polysilicon 45 only in the trench 17. In this step, the cell transistor 12 is completed. Then, as shown in FIG. 5H, in the peripheral circuit section D, an N⁻-type diffusion layer 27 is formed by conventional means, and a side wall oxide film 26 is formed on the side of the side wall of the gate electrode 25. Thereafter, the N⁺-type diffusion layer 28 is formed, resulting in completion of the transistor 14 of the peripheral circuit section. Subsequently, the semiconductor device is completed by forming the bit line, the cell capacitor, the Al wiring, and the like using conventional techniques. Thus, the semiconductor device of the present invention is completed which has the trench gate type cell transistor 12 and the planer type transistor of the peripheral circuit section.

In the first embodiment, the mask pattern used to form the trench of the memory cell array section C and the mask pattern used to form the gate electrode of the transistor of the peripheral circuit section D are provided by the same oxide film 21. The trench 17 of the cell array section C and the gate electrode 25 of the transistor of the peripheral circuit section can be formed by a single photolithography step, using these mask patterns. Therefore, additional photolithography steps are not required in comparison with the case where the trench and the gate electrode are formed by individual steps. Accordingly, the manufacturing steps are reasonable.

Furthermore, at the time of the formation of the gate electrode 25 of the transistor 14 in the peripheral circuit section D, there is little step difference between the peripheral circuit section D and the memory cell array section C, so that the gate electrode 25 of the transistor 14 in the peripheral circuit section D can be formed easily and with certainty. On the other hand, the gate electrode 19 of the cell transistor 12 can be formed by the etching-back step for the entire surface of the resultant structure. In the conventional technique which uses the same layer for the bit line of the memory cell array section and for the gate electrode of the transistor of the peripheral circuit section, there is a high step difference between the peripheral circuit section and the memory cell array section, so that an unetched portion remains after etching to facilitate formation of the gate electrode of the transistor in the peripheral circuit section due to this step difference. This results in difficulties in patting the bit line because of a decrease in focusing margin on the photolithography step. In the manufacturing method of this embodiment, this problem is solved.

Furthermore, in the manufacturing method of this embodiment of the present invention, the cell transistor 12 of the transistor in the memory cell array section C and the transistor 14 in the peripheral circuit section D are formed approximately at the same time. An interlayer insulating film between word and bit lines in the memory cell array section is not present, as in the conventional manufacturing method, at the time of the formation of the gate insulating film (an oxide film) of the transistor in the peripheral circuit section. Therefore, reliability of the gate insulating film of the transistor in the peripheral circuit section is not deteriorated due to impurities contained in the gate electrode formed in the memory cell array section and the interlayer insulating film.

The manufacturing method of the first embodiment of the present invention is illustrated using the n-channel type transistor as the transistor in the peripheral circuit section. It is matter of course that the invention may be practical using p-channel type transistors. In addition, in this embodiment, although polysilicon and WSi are used for the gate electrode material of the transistor in the peripheral circuit section, other material such as tungsten (W), titanium Ti), titanium silicide (TiSi), and other suitable materials may be used without departing from the spirit and scope of the present invention. In addition, although the present invention is illustrated using the LOCOS method for the element isolation, other element isolation means such as trench isolation may alternatively be employed. Moreover, as shown in FIG. 4, in this embodiment, although the shape of the element region of the memory cell array section is made T-character shaped, other shapes may be used. Furthermore, although in this embodiment the cell capacitor is shown located above the bit line, the position of the cell capacitor is not limited to the above. For example, a trench type capacitor may be adopted. Furthermore, techniques other than photolithography may be used to remove material during the manufacturing process.

A manufacturing method of a semiconductor device of a second embodiment of the present invention will be described below with reference to FIGS. 6A to 6F.

The second embodiment shows a transistor in the peripheral circuit section having improved characteristics. FIGS. 6A to 6F show manufacturing steps of the manufacturing method of the second embodiment. The step shown in FIG. 6A is similar to that shown in FIG. 5E of the first embodiment. The steps prior to the step illustrated by FIG. 6A are similar to those of the first embodiment, and the descriptions and illustrations for those steps are omitted in this discussion. In addition, the same reference numerals are used for the same components in the drawings as those in first embodiment.

First, similar to the first embodiment, as shown in FIG. 6A, an etching treatment using the oxide film 21 (a mask film) as a mask is performed, whereby the trench 17 is formed in the memory cell array section and the gate electrode 25 of the transistor 14 is formed in the peripheral circuit section D. Subsequently, in the second embodiment, as shown in FIG. 6B, a resist pattern 46 covering the memory cell array section C is formed. Then, impurity ions 47 are implanted into the periphery circuit section D, whereby the N⁻-type diffusion layer 27 of the periphery circuit D is formed.

Subsequently, by performing an oxidation treatment, as shown in FIG. 6C, an oxide film 48 is formed in the trench 17 of the memory cell array section C and it is also on the exposed portions of the silicon substrate 15, located in the side surfaces thereof, in the periphery circuit section D. At this time, the oxide film 48 formed in the trench 17 is to serve as the gate insulating film 18 of the cell transistor 21. In addition, a thickness of the oxide film is set to be thicker than that of the gate insulating film 22 of the transistor 14 of the periphery circuit section D. In general, when a gate oxide film is thick, driving current is reduced. However, for the cell transistor, a relatively small reduction of the driving current is not appreciably detrimental to the operation thereof. WSi is used as a material of the upper gate electrode 24 of the transistor 14 of the peripheral circuit section D, just as with the first embodiment. However, in the event that the side surface of the upper gate electrode is oxidized by this oxidation treatment, an oxidation-proof material such as platinum (Pt) may be used. This results in a later-described side wall gate that is electronically connected to the upper gate electrode 24, the side surface of which is not oxidized.

Next, as shown in FIG. 6D, polysilicon film (the gate electrode basic material) 49 that is 100 nm thick is deposited on the entire surface of the resultant structure. The film 49 is to serve as the gate electrode of the cell transistor and as the side wall gate of the transistor of the peripheral circuit section D. Then, the entire surface of the resultant structure is subjected to the etched-back treatment. Consequently, in the memory cell array section C, the polysilicon film 49 is left in the trench 17 whereby the gate electrode 19 of the cell transistor 12 is formed. At the same time, the polysilicon film 49 is left also on the side wall of the gate electrode 25 of the transistor in the peripheral circuit section D whereby the side wall gate 50 is formed. At the time of this etched-back treatment, the polysilicon film is left only in the trench by performing the isotropic etching treatment illustrated in connection with the first embodiment. In the second embodiment, by performing the anisotropic etching treatment using the mixing gas of HBr and Cl₂, the polysilicon film 49 can be left on the side wall of the gate electrode 25 of the transistor in the peripheral circuit section D, as well as in the trench 17 in the memory cell array section C. In this manufacturing step, the cell transistor 21 is completed.

Finally, as shown in FIG. 6F, the N⁺-type diffusion layer 28 of the transistor 14 in the peripheral circuit section D is formed, so that the transistor 14 of the peripheral circuit section D is completed. In the subsequent manufacturing steps, the bit line, the cell capacitor, and the Al wiring and the like are formed using conventional techniques to complete the semiconductor device of the second embodiment of the present invention having the trench gate type cell transistor 12 of the memory cell array section C and the planer type transistor 14 of the peripheral circuit section D.

Also in the second embodiment, the same advantages as the first embodiment can be obtained. Specifically, (1) since the trench of the memory cell array section and the gate electrode of the transistor of the peripheral circuit section can be formed by one photolithography step, the manufacturing steps will be reasonable; and (2) there is no almost step difference between the peripheral circuit section and the memory cell array section, so that the gate electrode of the transistor in the peripheral circuit section can be formed easily and with certainty, and reliability of the gate insulating film of the transistor in the peripheral circuit section may be provided.

In addition to this, in the case of the second embodiment, in the transistor 14 of the peripheral circuit section, the gate insulating film 22 formed initially is present beneath the gate electrode 25, and the oxide film 48 having the same thickness as that of the gate insulating film 18 of the cell transistor 12 is formed under the side wall gate 50, located at the side of the gate electrode 25. Specifically, when viewing the whole of the gate insulating film of the transistor 14 in the peripheral circuit section, the gate electrode has such a structure that an end portion of the gate electrode is made thicker than a center thereof. Therefore, in the case of the second embodiment, the transistor 14 of the peripheral circuit section D has more preferable characteristics, compared to that of the first embodiment, in that hot-carrier resistance, especially conspicuous in the end portion of the gate electrode, is enhanced.

Furthermore, in the second embodiment, the buried type gate electrode 19 of the cell transistor 12 in the memory cell array section C and the side wall gate 50 of the transistor 14 in the peripheral circuit section D can be simultaneously formed with one etched-back treatment. Therefore, separate steps to form them individually are not required so that the manufacturing processes can be simplified.

While the present invention has been particularly shown and described with reference to the preferred embodiments thereof, it will be easily understood by those skilled in the art that the various changes and modifications may be made, and equivalent elements may be substituted for elements thereof without departing from the scope of the present invention. For example, the descriptions for the first and second embodiments was made concerning the DRAM which comprises the trench gate type transistor in the memory cell array section and the planer type transistor in the peripheral circuit section. However, the present invention may be applicable to various kinds of semiconductor devices, as long as they comprise both of the trench gate type transistor and the planer transistor.

As described above in detail, in the present invention, formation of the trench of the trench gate type transistor and formation of the gate electrode of the planer type transistor are performed in the simultaneous photolithography step, so that the manufacturing processes will be reasonable without increasing the number of the photolithography steps, in comparison with the conventional manufacturing method. In addition, the gate electrodes of each of the transistors are formed of the layers located approximately at the same level, so that the high step difference between the memory cell array section and the peripheral circuit section are not produced, leading to easy formations of the gate electrodes of each of the transistors with certainty. Therefore, according to the present invention, since the trench gate type transistor that is resistant to a short channel effect is formed in a region where micronization of the device is required and the planer type transistor having an ability of a high speed operation is formed in a region where drivability is required in a single device, the semiconductor device reconciling the micronization and excellent characteristic can be provided.

What is claimed is:

1. In a method of manufacturing a semiconductor device having a trench gate transistor with a gate electrode buried in a trench formed in a semiconductor substrate and having a planar transistor with a gate electrode formed on the semiconductor substrate, the steps of:

a first photolithography step for forming the trench of the trench gate transistor; and a second photolithography step for forming the gate electrode of the planar transistor, wherein said first and second steps are performed simultaneously.

2. A method of manufacturing a semiconductor device having a memory cell array section that uses a trench gate transistor as a cell transistor with a gate electrode buried in a trench formed in a semiconductor substrate and having a peripheral circuit section that uses a planar transistor as a peripheral transistor with a gate electrode formed on the semiconductor substrate, the method comprising the steps of:

forming a first resultant structure by sequentially forming a gate insulating film for the peripheral transistor on the semiconductor substrate and subsequently forming a gate electrode basic material on the gate insulating film;

depositing a mask film on a first entire surface of the first resultant structure;

using photolithography to selectively remove the mask film in a region of the memory cell array section where the trench is to be formed and to selectively remove the mask film in a region of the peripheral circuit section other than where the gate electrode of the peripheral transistor is to be formed;

etching the semiconductor substrate in the memory cell array section using the mask film as a mask to form the trench, and etching the gate electrode basic material of the peripheral circuit section to form the gate electrode of the peripheral transistor; and sequentially forming a gate insulating film and subsequently forming the gate electrode for the cell transistor in the trench.

3. A method according to claim 2, further comprising the steps of:

causing the gate insulating film of the cell transistor to be thicker than the gate insulating film of the peripheral circuit section;

simultaneously forming the gate insulating film on the semiconductor substrate corresponding to a side wall of the gate electrode of the peripheral transistor and forming the gate insulating film for the cell transistor;

forming a side wall gate on a side wall of the gate electrode of the peripheral transistor; and leaving the gate insulating film on a bottom portion of the side wall gate.

4. A method according to claim 3, further comprising the steps of:

providing a second resultant structure by simultaneously forming the gate insulating film in the trench and on the semiconductor substrate of the side of the gate electrode of the peripheral transistor;

forming the gate electrode basic material for the cell transistor on a second entire surface of the second resultant structure; and following forming the gate electrode basic material, performing an etched-back treatment for the second entire surface by an anisotropic etching, whereby the gate electrode of the cell transistor is formed in the trench and, at the same time, forming the side wall gate of the gate electrode of the peripheral transistor.

5. A method of manufacturing a semiconductor device containing a trench transistor and a planar transistor, comprising the steps of:

forming, on a semiconductor substrate, a gate insulating film for the planar transistor;

providing a resultant structure by forming a gate electrode basic material on the gate insulating film;

depositing a mask film on an entire surface of the resultant structure;

selectively removing the mask film to provide a region for a trench of the trench transistor and removing the mask film in proximity to the gate electrode basic material of the planar transistor;

etching the semiconductor substrate using the mask; and forming a gate insulating film of the trench transistor and subsequently forming the gate electrode thereon using the gate electrode basic material.

6. A method according to claim 5, wherein selectively removing the mask film includes using photolithography.

7. A method according to claim 5, wherein forming the gate electrodes for at least one of the transistors includes forming an n-channel transistor.

8. A method according to claim 5, wherein forming the gate electrodes for at least one of the transistors includes forming a p-channel transistor.

9. A method according to claim 5, farther comprising the step of:

forming at least one cell capacitor that is electrically connected to the trench transistor.

10. A method according to claim 9, wherein forming the at least one cell capacitor includes forming the cell capacitor in a plane other than a plane containing the transistors.

11. A method according to claim 5, further comprising the step of:

selecting the gate electrode basic material from one or more of the group consisting of: tungsten silicide, polysilicon, tungsten, titanium, and titanium silicide.

12. A method of manufacturing a semiconductor device having a trench gate transistor with a gate electrode buried in a trench formed in a first portion of a semiconductor substrate and having a planar gate transistor with a gate electrode formed on a gate insulating film covering a second portion of said semiconductor substrate, comprising:

forming said gate insulating film on said second portion of said semiconductor substrate;

forming a gate material layer on said gate insulating film; and forming a first mask pattern and a second mask pattern simultaneously with each other, said first mask pattern being over said first portion of said semiconductor substrate to define said trench for said trench gate transistor and said second mask pattern being over said gate material layer to define said gate electrode for said planar gate transistor, wherein said gate electrode is made of said gate material layer.

13. The method as claimed in claim 12, further comprising selectively etching said gate material layer and said first portion of said semiconductor substrate using said first and second mask patterns to form said gate electrode and said trench.

* * * * *